United States Patent [19]

Finn et al.

[11] Patent Number: 4,679,308
[45] Date of Patent: Jul. 14, 1987

[54] PROCESS FOR CONTROLLING MOBILE ION CONTAMINATION IN SEMICONDUCTOR DEVICES

[75] Inventors: Chris J. Finn; Daniel W. Youngner, both of Maple Grove, Minn.

[73] Assignee: Honeywell Inc., Minneapolis, Minn.

[21] Appl. No.: 681,768

[22] Filed: Dec. 14, 1984

[51] Int. Cl.$^4$ .................. H01L 21/20; B01J 17/00
[52] U.S. Cl. .................. 29/576 B; 29/571; 148/1.5; 148/187; 148/DIG. 24; 148/DIG. 61; 357/91
[58] Field of Search ............... 148/1.5, 187; 29/576 B, 29/571; 357/91

[56] References Cited

U.S. PATENT DOCUMENTS

| | | | |
|---|---|---|---|
| 3,799,813 | 3/1974 | Danchenko | 148/1.5 |
| 3,852,120 | 12/1974 | Johnson et al. | 148/1.5 |
| 4,001,049 | 1/1977 | Baglin et al. | 148/1.5 |
| 4,047,974 | 9/1977 | Harari | 148/1.5 |
| 4,081,292 | 3/1978 | Aoki et al. | 148/1.5 |
| 4,162,176 | 7/1979 | Tsuda | 148/1.5 |
| 4,197,144 | 4/1980 | Kirkpatrick et al. | 148/1.5 |
| 4,258,077 | 3/1981 | Mori et al. | 148/1.5 |
| 4,454,524 | 6/1984 | Spence | 357/23 |
| 4,466,839 | 8/1984 | Dathe et al. | 148/1.5 |
| 4,502,894 | 3/1985 | Seto et al. | 148/1.5 |
| 4,535,528 | 8/1985 | Chen et al. | 29/571 |
| 4,544,416 | 10/1985 | Meador et al. | 148/1.5 |

OTHER PUBLICATIONS

Ahn et al., IBM-TDB, 13 (1970), 1798.
El-Kareh, IBM-TDB, 27 (1984), 3036.

Primary Examiner—Upendra Roy
Attorney, Agent, or Firm—William T. Udseth

[57] ABSTRACT

The present invention provides a method of protecting semiconductor integrated circuit from mobile ion contamination. In one embodiment a gettering agent is implanted into a dielectric layer. In an alternative embodiment a gettering agent is implanted into a photoresist layer which is ashed in an oxygen based plasma, leaving the gettering agent on the surface underlying the photoresist.

18 Claims, 6 Drawing Figures

PROCESS FOR CONTROLLING MOBILE ION CONTAMINATION IN SEMICONDUCTOR DEVICES

The present application relates to methods of improving the yield rate of semiconductor manufacturing processes and the reliability of semiconductor devices produced thereby, and more particularly to reducing defects caused by mobile ions, such as those of sodium, left on or in a semiconductor wafer or an associated dielectric following such a manufacturing process.

BACKGROUND OF THE INVENTION

In the processing of semiconductor integrated circuits a layer of a dielectric material, such as silicon dioxide, will often be formed to cover and protect many of the electronic devices formed in the semiconductor material. A problem which arises during the manufacturing of such semiconductor processes is the contamination of such a surface dielectric with mobile ions. Sodium ions, in particular, are a common source of problems.

The deeper such mobile ions are embedded in the dielectric layer the greater is the problem associated with them. Two types of problems are particularly great. One problem is the undesirable leakage path such ions can provide between different semiconductor regions through the dielectric. The second problem is that the electric charge on such ions can act to provide an electrical bias to semiconductor regions underlying the dielectric layer, thereby shifting thresholds of semiconductor devices.

Such mobile ion contamination can come from a number of sources. For example, various metals are commonly sputtered onto the surface of the semiconductor itself, such as for contact pads, or onto the surface of the dielectric layer. Sputtering targets used to provide the metal to be sputtered commonly contain trace amounts of sodium contamination. Much of this sodium will become embedded in the dielectric material where it acts, as described above, as mobile ion contamination. Another common source of sodium contamination arises during any process involving a plasma. Various polymer materials used in the construction of plasma containers contain sodium. The operation of the plasma will leach some of this sodium out of the polymer whereby it may become implanted in the dielectric material. The increasing use of plasma etching and plasma resist stripping have greatly increased the mobile ion contamination coming from this source. A third source of mobile ion contamination arises from the photoresists used in semiconductor processing. Many of these photoresists contain trace amounts of sodium. When such photoresists are removed by ashing in an oxygen based plasma, a common technique, the sodium contained therein is deposited on the surface of the underlying dielectric.

The prior art approach to the problem of mobile ion contamination is to replace the silicon dioxide layer with a layer of a phoso-silicate glass formed by low pressure chemical vapor deposition. Each phosphorus atom in the phoso-silicate glass is capable of binding and neutralizing one sodium atom. The sodium atoms thus bound and neutralized will not contribute to the problems described above.

The problem with the prior art approach relates to the properties of the phoso-silicate glass. Among the problems related to such glasses are that they have unacceptably high defect levels as compared with silicon dioxide, they provide poor step coverage over features in the underlying semiconductor, they require high temperature processing, and may contribute to corrosion of metals. Furthermore, as stated above, phoso-silicate glasses are formed by low pressure chemical vapored deposition when, in some instances, other techniques such as thermal oxidation of a silicon wafer may be preferrable.

SUMMARY OF THE INVENTION

In the present invention the disadvantages of the phoso-silicate glass are avoided by forming a dielectric layer, typically silicon dioxide, by any desired means and then ion implanting therein a material capable of gettering the mobile ions. In a preferred embodiment, the gettering agent includes phosphorus. In another aspect of the invention, a mobile ion gettering agent is ion implanted into a layer of photoresist. When the photoresist is ashed, the sodium impurities are neutralized by the gettering agent. Furthermore, that portion of the implanted gettering agent which is not required to neutralize sodium atoms in the resist material will remain on or in the underlying layer and be available for neutralizing mobile ion contaminants which are produced by later steps in the processing of the wafer.

DETAILED DESCRIPTION OF THE INVENTION

The present invention will be described in the context of a semiconductor integrated circuit formed in a silicon wafer using an overlying layer of silicon dioxide as a dielectric. Those skilled in the art will readily perceive that the invention is not limited to these particular materials. Other semiconductor materials could be used and other dielectrics could likewise overlie the semiconductor.

Figure 1A:
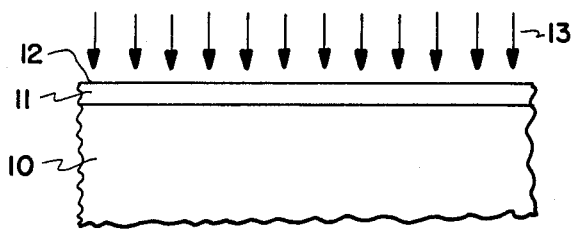
FIGS. 1A through 1C show steps in one embodiment of the invention.

FIG. 1A illustrates a portion of a semiconductor wafer to be used in the process of the invention. Shown in FIG. 1A is a silicon substrate 10, which would normally have constructed therein semiconductor devices or portions thereof. These semiconductor devices are not shown in FIG. 1A. A layer of silicon dioxide 11, having a major surface 12, is formed overlying wafer 10. Silicon dioxide layer 11 may be formed by thermal oxidation, chemical vapor deposition or any other method desired for the particular process. A dopant material is then implanted into silicon dioxide layer 11. In the preferred embodiment the dopant is phosphorus, although any material capable of gettering mobile ions, in particular sodium, may be used. Other possible choices include arsenic and antimony.

The dopant which is selected is implanted with a dose level preferrably in the range of $10^{13}$ions/cm$^2$ to $10^{17}$ions/cm$^2$. The implantation energy is preferrably in the range of 5 KeV to 500 KeV. The key feature is to maintain the implantation energy at a level low enough that few, if any, of the ions thus implanted will penetrate the silicon dioxide layer and enter the underlying semiconductor wafer. In FIG. 1A the implantation of the ions into silicon dioxide layer 11 is shown schematically by arrows 13.

Figure 1B:
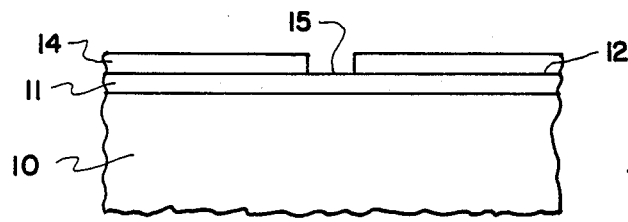
Figure 1C:
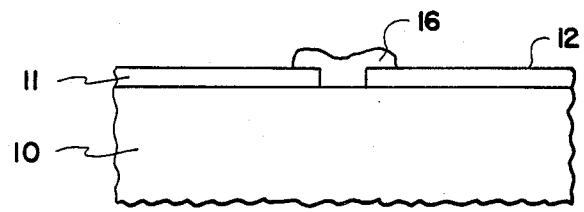

Following the doping of silicon dioxide layer 11, any other processing steps desired may be used. During such processing the dopant will provide protection from mobile ion contamination. FIGS. 1B and 1C illustrate a typical step, the formation of an electrical contact pad to provide an electrical connection to devices formed in silicon wafer 10.

The formation of such a pad does not constitute a part of the invention and is shown as an example only.

FIG. 1B illustrates a layer of a resist material, typically a photoresist, 14 which has been formed on layer 11. Photoresist layer 14 is exposed and developed, leaving a region 15 of surface 12 of silicon dioxide layer 11 exposed. The structure of 1B is then subjected to an etching process, such as a plasma etch, in order to form a via through silicon dioxide layer 11. Following the etching step, photoresist layer 14 is removed and standard semiconductor processing techniques are used to form metallic electrical contact pad 16 of FIG. 1C.

Figure 2A:
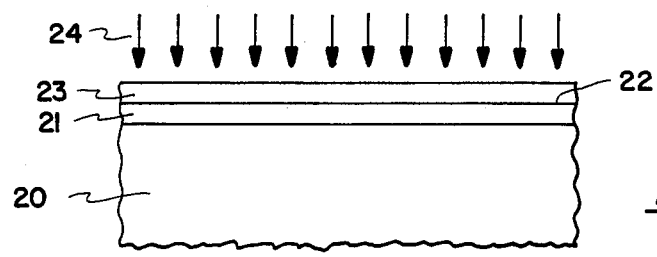
FIGS. 2A through 2C show steps in an alternative embodiment of the invention.
Figure 2B:
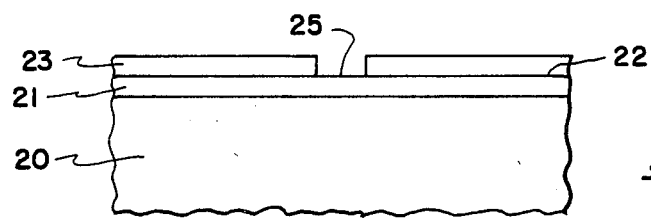
Figure 2C:
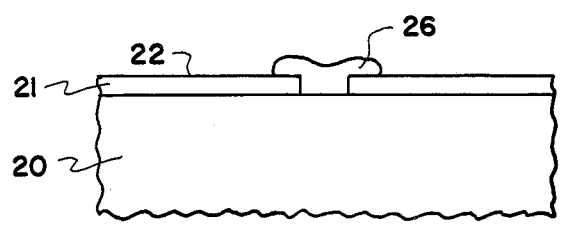

FIGS. 2A, 2B, and 2C show an alternative embodiment of the method of the invention. FIG. 2A shows a portion of a semiconductor wafer 20, which, as in FIG. 1A, would typically have integrated circuit structures formed therein. A layer of dielectric material 21 having a major surface 22 overlies semiconductor material 20. A layer of an organic material, typically a resist material, such as a photoresist 23, overlies dielectric layer 21. A material capable of gettering mobile ions is then implanted into resist layer 23. As in the example of FIG. 1A, the preferred material is phosphorus although other materials such as arsenic or antimony could be used. Likewise, the preferred dose level is in the range of $10^{13}$ions/cm$^2$ to $10^{17}$ions/cm$^2$ and at an energy in the range of 5 KeV to 500 KeV.

As in the previous example, any desired semiconductor processing steps may now be performed while the resist is in place. As above, the example of the formation of a metallic contact pad will be used. As shown in FIG. 2B resist layer 23 is exposed and developed exposing a portion 25 of surface 22 of dielectric layer 21. The structure is then subjected to an etching process in order to open a via through dielectric layer 21.

Photoresist layer 23 is then removed by ashing in an oxygen based plasma. The ashing process removes resist layer 23 while depositing the gettering agent implanted therein on surface 22. During the ashing process or subsequent processing steps, a portion of the gettering agent may diffuse into dielectric layer 21. While this is not required for the process of the invention to be effective, such diffusion will not adversely affect the process.

Following the ashing of resist layer 23 any subsequent desired processing may proceed with the circuit protected from problems related to mobile ions. In the example being described, electrical contact pad 26 of FIG. 2C is formed by standard techniques.

The embodiments of the invention in which an exclusive property or right is claimed are defined as follows:

1. A process for controlling mobile ion contamination in semiconductor devices comprising the steps of:
   forming a layer of a dielectric material on a major surface of a semiconductor body;
   forming a layer of an organic material overlying said dielectric material;
   implanting a mobile ion gettering agent into said layer of organic material using an implantation energy in a range such that a substantial amount of said gettering agent remains in said layer of organic material;
   ashing said layer of organic material in an oxygen based plasma; and
   performing subsequent processing steps.

2. The process of claim 1 wherein said gettering agent includes a material selected from the group consisting of phosphorus, arsenic, and antimony.

3. The process of claim 1 whreein said organic material is a resist material.

4. The process of claim 2 wherein said gettering agent is phosphorus.

5. The process of claim 2 wherein said gettering agent is implanted at a dose level in the range of $10^{13}$ions/cm$^2$ to $10^{17}$ions/cm$^2$.

6. The process of claim 2 wherein said gettering agent is implanted into said dielectric with an energy in the range of 5 KeV to 500 KeV.

7. The process of claim 3 wherein said gettering agent includes a material selected from the group consisting of phosphorus, arsenic, and antimony.

8. The process of claim 5 wherein said gettering agent is phosphorus.

9. The process of claim 5 wherein said gettering agent is implanted with an energy in the range of 5 KeV to 500 KeV.

10. The process of claim 6 wherein said gettering agent is phosphorus.

11. The process of claim 9 wherein said gettering agent is phosphorus.

12. The process of claim 7 wherein said gettering agent is phosphorus.

13. The process of claim 7 wherein said gettering agent is implanted at a dose level in the range of $10^{13}$ions/cm$^2$ to $10^{17}$ions/cm$^2$.

14. The process of claim 7 wherein said gettering agent is implanted into said dielectric with an energy in the range of 5 KeV to 500 KeV.

15. The process of claim 13 wherein said gettering agent is phosphorus.

16. The process of claim 13 wherein said gettering agent is implanted with an energy in the range of 5 KeV to 500 KeV.

17. The process of claim 14 wherein said gettering agent is phosphorus.

18. The process of claim 16 wherein said gettering agent is phosphorus.

* * * * *